United States Patent
Rochford

(10) Patent No.: US 9,979,316 B2
(45) Date of Patent: May 22, 2018

(54) IMPEDANCE COMPENSATION BASED ON RATIO OF BUS VOLTAGE AND AMPLIFIER FUNDAMENTAL AC OUTPUT VOLTAGE

(71) Applicant: WITRICITY CORPORATION, Watertown, MA (US)

(72) Inventor: Conor Joseph Rochford, Boston, MA (US)

(73) Assignee: WITRICITY CORPORATION, Watertown, MA (US)

( * ) Notice: Subject to any disclaimer, the term of this patent is extended or adjusted under 35 U.S.C. 154(b) by 0 days. days.

(21) Appl. No.: 15/587,606

(22) Filed: May 5, 2017

(65) Prior Publication Data
US 2017/0324351 A1    Nov. 9, 2017

Related U.S. Application Data

(60) Provisional application No. 62/332,198, filed on May 5, 2016.

(51) Int. Cl.
| | |
|---|---|
| G05F 1/63 | (2006.01) |
| H02M 7/219 | (2006.01) |
| G05F 1/10 | (2006.01) |
| G05F 1/30 | (2006.01) |
| G05F 1/613 | (2006.01) |
| H02M 7/23 | (2006.01) |
| H02M 7/25 | (2006.01) |
| H03F 3/217 | (2006.01) |
| H02J 50/12 | (2016.01) |
| H02J 50/80 | (2016.01) |

(Continued)

(52) U.S. Cl.
CPC .............. *H02M 7/219* (2013.01); *G05F 1/10* (2013.01); *G05F 1/30* (2013.01); *G05F 1/613* (2013.01); *H02J 50/12* (2016.02); *H02J 50/80* (2016.02); *H02M 7/23* (2013.01); *H02M 7/25* (2013.01); *H03F 3/2176* (2013.01); *H02M 2001/0093* (2013.01); *H02M 2007/4818* (2013.01)

(58) Field of Classification Search
CPC ... H02M 2007/4818; H02J 50/12; G05F 1/63; G05F 1/656
See application file for complete search history.

(56) References Cited

U.S. PATENT DOCUMENTS

| | | | |
|---|---|---|---|
| 2013/0099587 A1* | 4/2013 | Lou | H01F 38/14 307/104 |
| 2014/0103738 A1 | 4/2014 | Campanella et al. | |

(Continued)

OTHER PUBLICATIONS

PCT International Search Report and Written Opinion dated Aug. 2, 2017 for International Application No. PCT/US2017/031239; 16 Pages.

*Primary Examiner* — Harry Behm
(74) *Attorney, Agent, or Firm* — Daly, Crowley, Mofford & Durkee, LLP

(57) ABSTRACT

Methods and apparatus provide compensation for impedance changes in a network energized by an amplifier, such as a class E amplifier. In embodiments, bus voltage amplifier fundamental AC output voltage can be used to generate a feedback signal for adjusting impedance of one or more components in the network. In embodiments, the amplifier fundamental AC output voltage is determined from current to the load, wherein the load is coupled to the amplifier by an LCL impedance matching network.

27 Claims, 14 Drawing Sheets

(51) Int. Cl.
*H02M 7/48* (2007.01)
*H02M 1/00* (2006.01)

(56) References Cited

U.S. PATENT DOCUMENTS

2015/0249359 A1   9/2015   Gunderson
2016/0043571 A1   2/2016   Kesler et al.
2016/0056639 A1   2/2016   Mao \* cited by examiner

IMPEDANCE COMPENSATION BASED ON RATIO OF BUS VOLTAGE AND AMPLIFIER FUNDAMENTAL AC OUTPUT VOLTAGE

CROSS REFERENCE TO RELATED APPLICATIONS

The present application claims the benefit of U.S. Provisional Patent Application No. 62/332,198, filed on May 5, 2016, which is incorporated herein by reference.

SUMMARY

Power transfer systems may rely on electronic circuits such as rectifiers, AC (Alternating Current) to DC (Direct Current) converters, impedance matching circuits, and other power electronics to condition, monitor, maintain, and/or modify the characteristics of the voltage and/or current used to provide power to electronic devices. Power electronics can provide power to a load with dynamic input impedance characteristics. In some cases, in order to enable efficient power transfer, a dynamic impedance matching network is provided.

In some applications, such as wireless power transfer, impedances for a wireless power apparatus may vary dynamically. In such applications, for example, impedance matching between a load, such as a resonator coil, and a power supply of the apparatus may be used to prevent unnecessary energy losses and excess heat. It is understood that the impedance matching network can be used to transform the coil impedance in series with the reflected load impedance. The input impedance of the impedance matching network, which loads the amplifier, may have the highest possible magnitude while maintaining the minimum inductive reactive current possible for the amplifier to achieve soft switching. Accordingly, power transfer systems transferring and/or receiving power via highly resonant wireless energy transfer, for example, may be required to configure or modify impedance matching networks to maintain efficient power transfer.

In one aspect, a method comprises: compensating for impedance changes in a network to energize a load, wherein the network is coupled to an amplifier which has a fundamental AC output voltage that varies with load impedance, by: determining a feedback signal based on a bus voltage and the amplifier fundamental AC output voltage, wherein the bus voltage corresponds to a voltage driving the amplifier and the amplifier fundamental AC output voltage corresponds to a fundamental component of voltage input to the load of the amplifier; and adjusting impedance of one or more components in the network based on the feedback signal.

An example method can further include one or more of the following features: the amplifier fundamental AC output voltage is determined from a measurement of current to the load, wherein the load is coupled to the amplifier by an LCL impedance matching network, directly measuring the amplifier fundamental AC output voltage, the amplifier fundamental AC output voltage is determined using at least one mixer and/or bandpass filter, the load includes a resonator having a coil, the network includes at least one capacitor coupled to the coil of the resonator, the network comprises an impedance matching network coupled to the coil, generating the feedback signal from a ratio of the bus voltage and the amplifier fundamental AC output voltage, maintaining a given ratio of the bus voltage and amplifier fundamental AC output voltage based on the feedback signal, maintaining a given ratio of the bus voltage and amplifier fundamental AC output voltage within a range based on the feedback signal, the range includes a minimum value and a maximum value, and further including decreasing an impedance in the network when the feedback signal is less than the minimum value and increasing an impedance in the network when the feedback signal is above the maximum value, adjusting impedance of one or more components in the network based on the feedback signal includes controlling a capacitor bank based on the feedback signal, the amplifier comprises at least one class E amplifier, and/or the load includes a resonator having a source coil, wherein resonator impedance changes in response to proximity of a device having a device resonator coil.

In another aspect, a system comprises: a network configured for energizing a load; an amplifier coupled to the network; and a processor to compensate for impedance changes in the network based on a bus voltage and a fundamental AC output voltage of the amplifier, wherein the bus voltage corresponds to a voltage driving the amplifier and the amplifier fundamental AC output voltage corresponds to a fundamental component of voltage input to the load of the amplifier. Example systems can further include one or more of the following features: the amplifier fundamental AC output voltage is determined from a measurement of current to the load, wherein the load is coupled to the amplifier by an LCL impedance matching network, directly measuring the amplifier fundamental AC output voltage, the amplifier fundamental AC output voltage is determined using at least one mixer and/or bandpass filter, the load includes a resonator having a coil, the network includes at least one capacitor coupled to the coil of the resonator, the network comprises an impedance matching network coupled to the coil, generating the feedback signal from a ratio of the bus voltage and the amplifier fundamental AC output voltage, maintaining a given ratio of the bus voltage and amplifier fundamental AC output voltage based on the feedback signal, maintaining a given ratio of the bus voltage and amplifier fundamental AC output voltage within a range based on the feedback signal, the range includes a minimum value and a maximum value, and further including decreasing an impedance in the network when the feedback signal is less than the minimum value and increasing an impedance in the network when the feedback signal is above the maximum value, adjusting impedance of one or more components in the network based on the feedback signal includes controlling a capacitor bank based on the feedback signal, the amplifier comprises at least one class E amplifier, and/or the load includes a resonator having a source coil, wherein resonator impedance changes in response to proximity of a device having a device resonator coil.

In a further aspect, an article comprises: a non-transitory computer readable medium containing stored instructions that enable a machine to: compensate for impedance changes in a network that includes a load, wherein the network is configured for coupling to an amplifier which has a fundamental AC output voltage that varies with load impedance, by: determining a feedback signal based on the bus voltage and the amplifier fundamental AC output voltage, wherein the bus voltage corresponds to a voltage driving the amplifier and the amplifier fundamental AC output voltage corresponds to a fundamental component of voltage input to the load of the amplifier; and generating one or more signals to adjust impedance of one or more components in the network based on the feedback signal.

An example article can include further instructions for one or more of the following features: the amplifier fundamental AC output voltage is determined from a measurement of current to the load, wherein the load is coupled to the amplifier by an LCL impedance matching network, directly measuring the amplifier fundamental AC output voltage, the amplifier fundamental AC output voltage is determined using at least one mixer and/or bandpass filter, the load includes a resonator having a coil, the network includes at least one capacitor coupled to the coil of the resonator, the network comprises an impedance matching network coupled to the coil, generating the feedback signal from a ratio of the bus voltage and the amplifier fundamental AC output voltage, maintaining a given ratio of the bus voltage and amplifier fundamental AC output voltage based on the feedback signal, maintaining a given ratio of the bus voltage and amplifier fundamental AC output voltage within a range based on the feedback signal, the range includes a minimum value and a maximum value, and further including decreasing an impedance in the network when the feedback signal is less than the minimum value and increasing an impedance in the network when the feedback signal is above the maximum value, adjusting impedance of one or more components in the network based on the feedback signal includes controlling a capacitor bank based on the feedback signal, the amplifier comprises at least one class E amplifier, and/or the load includes a resonator having a source coil, wherein resonator impedance changes in response to proximity of a device having a device resonator coil.

In a further aspect, a system comprises a network for energizing a load, an amplifier means for driving the network; and a processor means for controlling the amplifier means to compensate for impedance changes in the network based on a bus voltage and a fundamental AC output voltage of the amplifier, wherein the bus voltage corresponds to a voltage driving the amplifier means and the amplifier fundamental AC output voltage corresponds to a fundamental component of voltage input to the load of the amplifier.

BRIEF DESCRIPTION OF THE DRAWINGS

The foregoing features of this invention, as well as the invention itself, may be more fully understood from the following description of the drawings in which.

DETAILED DESCRIPTION

This disclosure provides embodiments for a system, such as a wireless power transfer system, having a network, such as an impedance matching, that tunes impedance and promotes efficient amplifier operation. In embodiments, a receiver placed near or on a power transmitter, for example, can alter the impedance of a source resonator coil and impact characteristics, such as power dissipation, of switching devices that energize the coil. In illustrative embodiments, a class E amplifier drives an impedance matching network of the source, where the amplifier is designed for a given load impedance. For class E amplifiers, the fundamental component of the voltage varies with load impedance. However, it may not be possible to directly measure the fundamental component of the ac voltage into an impedance matching network, for example. In embodiments, a feedback circuit provides feedback for measuring and compensating for load impedance changes and promoting low power dissipation in the amplifier switching devices and IMN magnetics.

Figure 1:
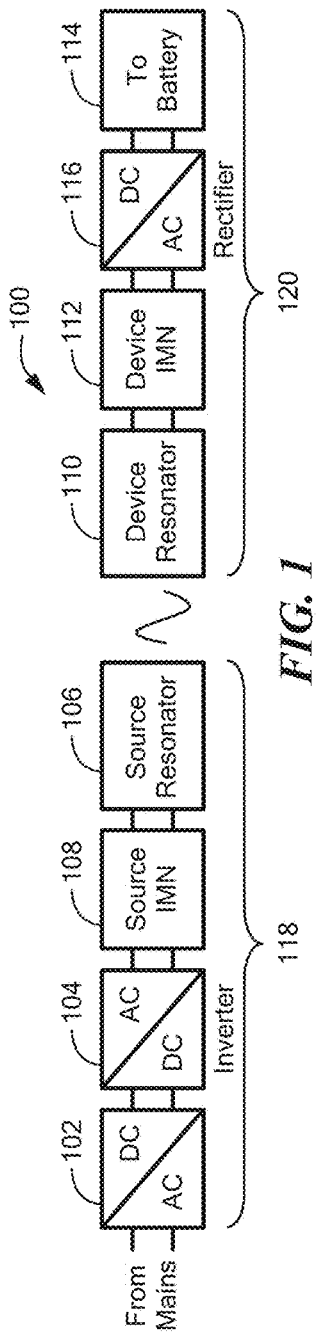
FIG. 1 is a schematic representation of a wireless energy transfer system.

FIG. 1 shows a high level functional block diagram of an exemplary embodiment of a wireless power transfer system 100 having feedback for load impedance change compensation. Input power to the system can be provided by wall power (AC mains), for example, which is converted to DC in an AC/DC converter block 102. Alternatively, a DC voltage can be provided directly from a battery or other DC supply. In embodiments, the AC/DC converter block 102 may be a power factor correction (PFC) stage. The PFC, in addition to converting the AC input (for example, at 50 or 60 Hz) to DC, can condition the current such that the current is substantially in phase with the voltage. A high efficiency switching inverter or amplifier 104 converts the DC voltage into an AC voltage waveform used to drive a source resonator 106. In embodiments, the frequency of the AC voltage waveform may be in the range of 80 to 90 kHz. In embodiments, the frequency of the AC voltage waveform may be in the range of 10 kHz to 15 MHz. In one particular embodiment, the frequency of the AC voltage waveform is about 6.78 MHz that may vary within a 15 kHz band due to FCC and CISPR regulations, for example. A source (transmitter) impedance matching network (IMN) 108 efficiently couples the inverter 104 output to the source resonator 106 and can enable efficient switching-amplifier operation. Class D or E switching amplifiers are suitable in many applications and can require an inductive load impedance for highest efficiency. The source IMN 108 transforms the source resonator impedance into such an impedance for the inverter 104. The source resonator impedance can be, for example, loaded by the coupling to a device (receiver) resonator 110 and/or output load. The magnetic field generated by the source resonator 106 couples to the device resonator 110, thereby inducing a voltage. This energy is coupled out of the device resonator 110 to, for example, directly power a load or charge a battery. A device impedance matching network (IMN) 112 can be used to efficiently couple energy from the device resonator 110 to a load 114 and optimize power transfer between source resonator 106 and device resonator 110. It may transform the actual load impedance into an effective load impedance seen by the device resonator 110 which more closely matches the loading for optimum efficiency. For loads requiring a DC voltage, a rectifier 116 converts the received AC power into DC. In embodiments, the source 118 and device (receiver) 120 can further include filters, sensors, and other components.

The impedance matching networks (IMNs) 108, 112 can be designed to maximize the power delivered to the load 114 at a desired frequency (e.g., 80-90 kHz, 100-200 kHz, 6.78 MHz) or to maximize power transfer efficiency. The impedance matching components in the IMNs 108, 112 can be chosen and connected so as to preserve a high-quality factor (Q) value of resonators 106, 110. Depending on the operating conditions, the components in the IMNs 108, 112 can be tuned to control the power delivered from the power supply to the load 114, for example, to maximize efficient wireless transfer of power. It is understood that tuning IMN 112 can directly affect the power delivered from the power supply to the load 114. Tuning capacitor C1s in IMN 108 may indirectly affect the power delivered from the power supply to the load 114. In embodiments, C1s is tuned to control the amplifier's reactive current in order to maintain soft switching and minimize excessive conduction loss.

The IMNs' (108, 112) components can include, for example, a capacitor or networks of capacitors, an inductor or networks of inductors, or various combinations of capacitors, inductors, diodes, switches, and resistors. The components of the IMNs can be adjustable and/or variable and can be controlled to affect the efficiency and operating point of the system. Impedance matching can be performed by varying capacitance, varying inductance, controlling the connection point of the resonator, adjusting the permeability of a magnetic material, controlling a bias field, adjusting the frequency of excitation, and the like. The impedance matching can use or include any number or combination of varactors, varactor arrays, switched elements, capacitor banks, switched and tunable elements, reverse bias diodes, air gap capacitors, compression capacitors, barium zirconium titanate (BZT) electrically tuned capacitors, microelectromechanical systems (MEMS)-tunable capacitors, voltage variable dielectrics, transformer coupled tuning circuits, and the like. The variable components can be mechanically tuned, thermally tuned, electrically tuned, piezo-electrically tuned, and the like. Elements of the impedance matching can be silicon devices, gallium nitride devices, silicon carbide devices, and the like. The elements can be chosen to withstand high currents, high voltages, high powers, or any combination of current, voltage, and power. The elements can be chosen to be high-Q elements.

The IMNs 108, 112 and/or control circuitry monitors impedance differences between the source 118 and the device 120 and provides control signals to tune the IMNs 108, 112 or components thereof. In embodiments, control circuitry indirectly monitors variation in source reflected load impedance by monitoring the ratio of the fundamental component of the amplifier drain voltage to the bus voltage driving the amplifier. In some implementations, the IMNs 108, 112 can include a fixed IMN and a dynamic IMN. For example, a fixed IMN may provide impedance matching between portions of the system with static impedances or to grossly tune a circuit to a known dynamic impedance range. In some implementations, a dynamic IMN can be further composed of a coarsely adjustable components and/or a finely adjustable components. For example, the coarsely adjustable components can permit coarse impedance adjustments within a dynamic impedance range whereas the finely adjustable components can be used to fine tune the overall impedance of the IMN(s). In another example, the coarsely adjustable components can attain impedance matching within a desirable impedance range and the finely adjustable components can achieve a more precise impedance around a target within the desirable impedance range.

Figure 1A:
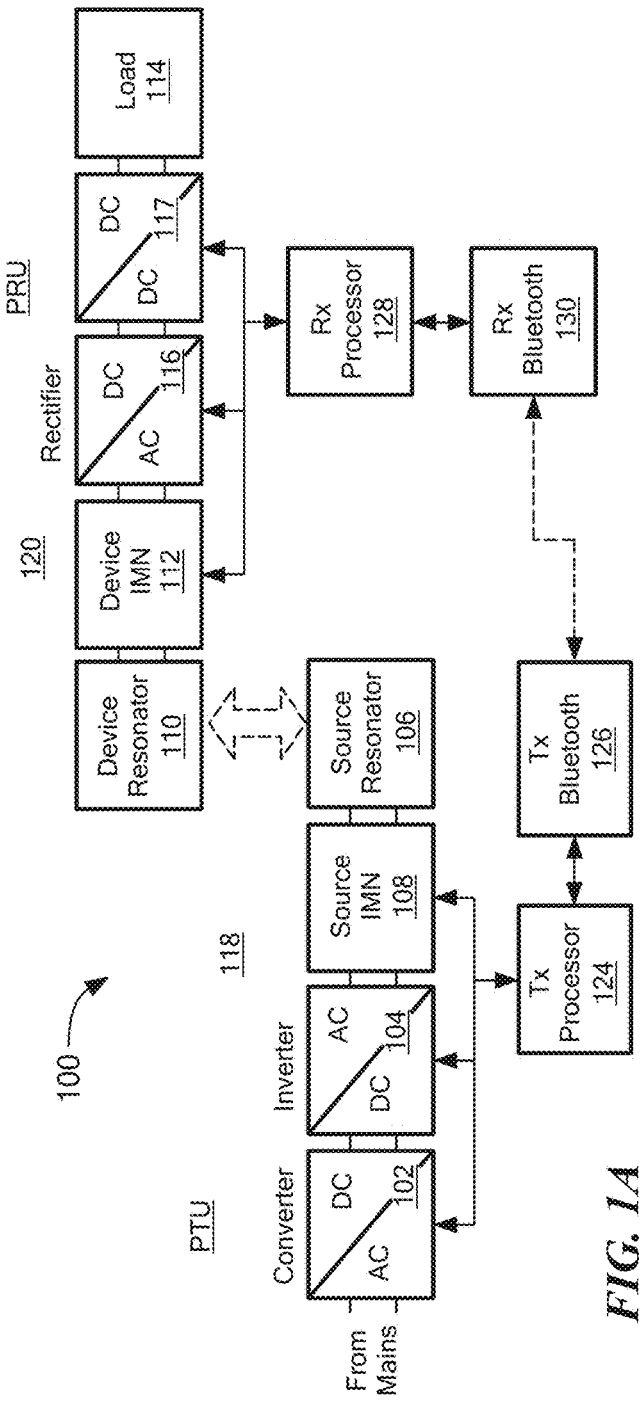
FIG. 1A is a further schematic representation of a wireless energy transfer system.

As shown in FIG. 1A, in which like reference numbers indicate like elements in FIG. 1, in embodiments, the source 118 can include a transmit processor module 124 to control overall operation of the source side components, and a wireless communication module 126 coupled to the transmit processor 124 to provide wireless communication to other units. It is understood that any suitable wireless communication technology can be used, such as Bluetooth®, BLE (Bluetooth® Low Energy), WiFi, radio, and the like. In embodiments, the source 118 can be provided as a power transmitting unit (PTU). As described more fully below, the transmit processor module 124 can receive and process feedback for load impedance change compensation.

The device 120, which can be provided as a power receiving unit (PRU) can include a receive processor module 128 to control the overall operation of the device components and a wireless communication module 130 to enable the PRU to communicate with PTU and/or PRU units.

In embodiments, such as for loads requiring a DC voltage, the rectifier 116 can convert the received AC power into DC and a DC/DC converter 117 can regulate the voltage level for the load 114. In embodiments, the source 118 and device 120 can further include filters, sensors, and other components.

Figure 2:
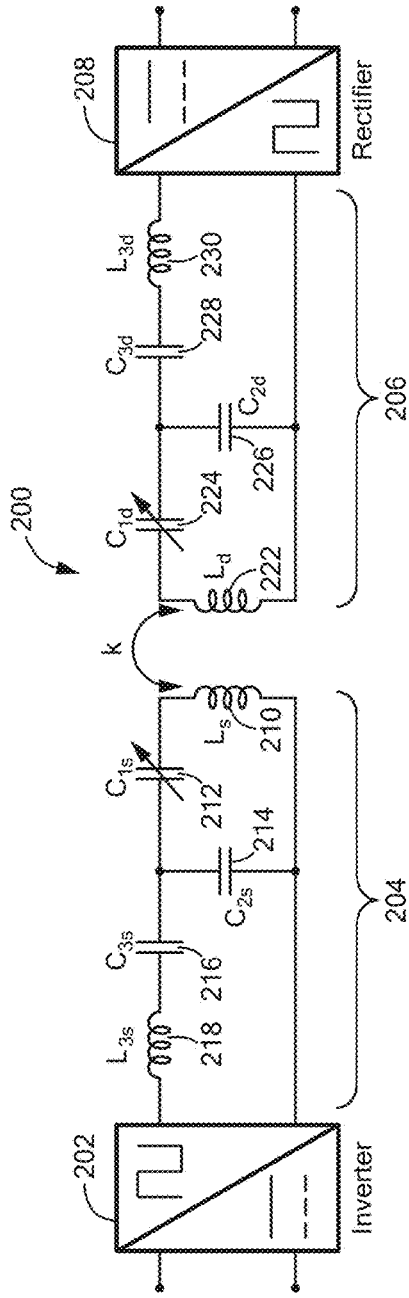
FIG. 2 is a schematic circuit representation of wireless energy transfer system including an illustrative impedance matching network (IMN)

FIG. 2 shows an exemplary embodiment of a wireless power transmission system 200 having an inverter 202 powering source or transmitter-side circuit (which includes source resonator and source IMN) 204, which couples, with coupling factor k, oscillating electromagnetic energy to the device or receiver-side circuit (which includes device resonator and device IMN) 206 with load impedance feedback for voltage regulation in accordance with example embodiments of the invention. In example embodiments voltage regulation in the power receiver is achieved through a relatively slow BLE (Bluetooth low energy) loop that instructs the power transmitter to adjust its resonators field strength by varying the DC bus voltage driving the amplifier. The oscillating energy is then converted by the rectifier 208. The source-side circuit 204 components include source resonator coil $L_s$ 210, series capacitor $C_{1s}$ 212 (in position 1), parallel capacitor $C_{2s}$ 214 (in position 2), and capacitor $C_{3s}$ 216 and inductor $L_{3s}$ 218 (in position 3). In the illustrative embodiment, capacitor $C_{1s}$ 216 can include one or more variable capacitors. Note that each of the components listed may represent networks or groups of components and that components in at least positions 1 and 3 can be balanced. The device-side circuit 206 components can include device resonator coil $L_d$ 222, series capacitor $C_{1d}$ 224 (in position 1), parallel capacitor $C_{2d}$ 226 (in position 2), and capacitor $C_{3d}$ 228 and inductor $L_{3d}$ 230 (in position 3). The capacitor $C_{1d}$ 224 can include one or more variable capacitors, such as a PWM capacitor, switched bank of capacitors, and varactors. The one or more variable capacitors can be discretely or continuously tunable capacitors. The variable capacitors 216, 228 can promote efficient wireless energy transfer, as described more fully below. It is understood that one or more of capacitor $C_{1s}$ 212 (in position 1), parallel capacitor $C_{2s}$ 214 (in position 2), and capacitor $C_{3s}$ 216 can include one or more variable capacitors to meet the needs of a particular application. Similarly, any of device side capacitor $C_{1d}$ 224 (in position 1), parallel capacitor $C_{2d}$ 226 (in position 2), and capacitor $C_{3d}$ 228 can include variable capacitors.

It is understood that the source and/or device impedance matching networks (IMNs) can have a wide range of circuit implementations with various components having impedances to meet the needs of a particular application. U.S. Pat. No. 8,461,719 to Kesler et al., which is incorporated herein by reference, discloses a variety of tunable impedance networks, such as in FIGS. 28a-37b, for example. It is further understood that any practical number of switched and/or tunable capacitors can be used on the source and/or device side to provide desired operating characteristics. In addition, while illustrative embodiments are shown and described in conjunction with highly resonant wireless energy transfer systems, it is understood that switched component embodiments are applicable to a wide range of applications in which it is desirable to achieve a given equivalent impedance. It is understood that switched component embodiments can also minimize inductive reactive current while maintaining the amplifiers soft switching.

Figure 3:
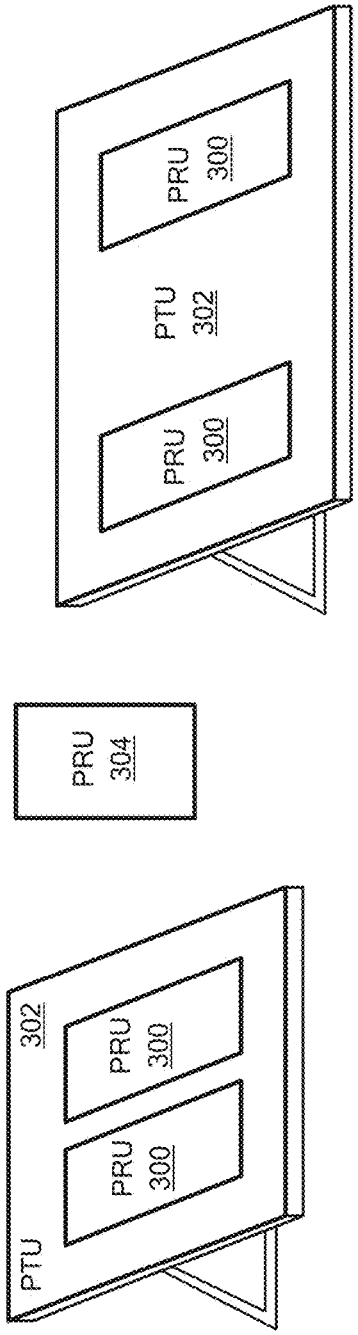
FIG. 3 is a representation of power receivers and power transmitters.

FIG. 3 shows various PRUs 300 on charging platforms of PTUs 302, as well a nearby PRU 304. In embodiments, a power transmitting unit (PTU) interacts with a power receiving unit (PRU) via an in-band channel and an out-of-band channel. As used herein, in-band refers to power transmission channel between the PTU 302 and PRU 300. As a PRU 300 is placed on or around a PTU 302, load impedance can be impacted. As described more fully below, feedback can be used to compensate for load impedance changes and promote efficient amplifier operating characteristics.

In embodiments, the PTU 300 can modulate the transmitted wireless energy to communicate with the PRU 302 and the PRU can modify certain characteristics, such as impedance, to communicate with the PTU. As used herein, out-of-band refers to wireless communication between a PTU 302 and PRU 300 via a wireless protocol, such as Bluetooth®. It is understood that any suitable wireless communication technology, protocol, etc., can be used to enable PTUs and PRUs to communicate with each other. It is understood that the terms in-band and out-of-band are used for convenience and should not be used to limit the claimed invention in any way.

Figure 4:
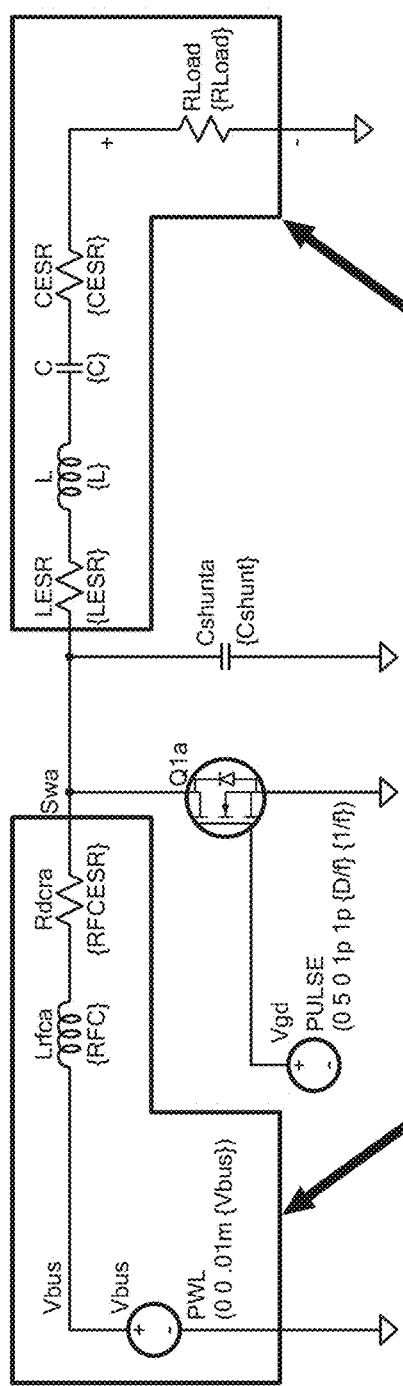
FIG. 4 is a circuit diagram of a class E amplifier that can provide a regulated voltage gain from DC input voltage to AC drain voltage at the Swa node into an resonant RLC load and an simplified equivalent circuit.
Figure 4A:
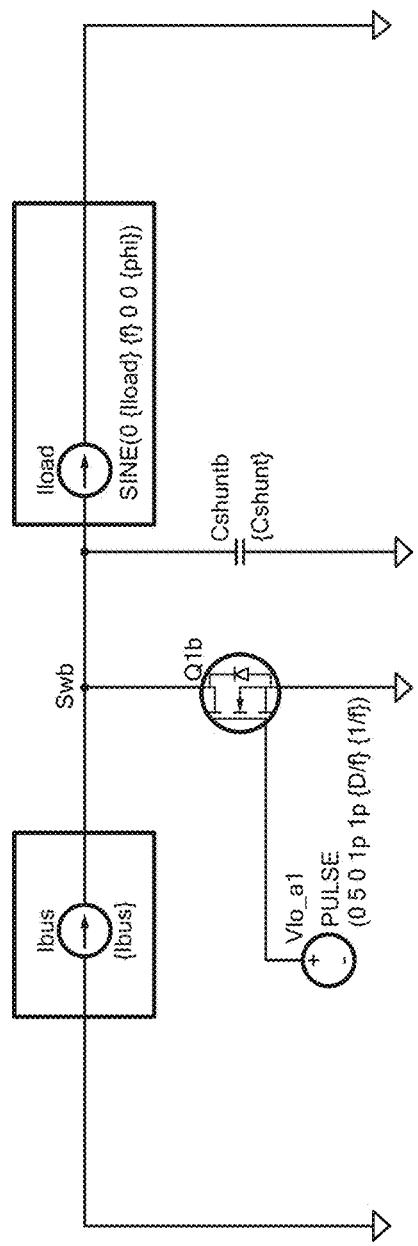
FIG. 4A is an equivalent circuit diagram for elements in FIG. 4 including current source $I_{Bus}$ as the equivalent circuit for $V_{Bus}$ and the choke $L_{rfca}$ and current source $I_{load}$ as the equivalent circuit for L, C, and $R_{load}$.

FIG. 4 shows an example class E amplifier for which impedance compensation can be provided and an equivalent circuit for the amplifier. Energy source $V_{Bus}$ is coupled in series with inductor $L_{rfca}$ (RF choke), which is coupled to node $Sw_a$, with equivalent series resistance $R_{dcra}$ shown. A switching element $Q_{1a}$ is coupled between node $Sw_a$ and ground. A shunt capacitor $C_{shunta}$ is coupled across the switching element $Q_{1a}$. From node $Sw_a$, capacitor C and inductor L and load $R_{load}$ are coupled in series. Inductor equivalent series resistance LESR and capacitor equivalent series resistance CESR are shown. FIG. 4A shows current source $I_{Bus}$ as the equivalent circuit for $V_{Bus}$ and the choke $L_{rfca}$ and current source $I_{load}$ as the equivalent circuit for L, C, and $R_{load}$.

Figure 5:
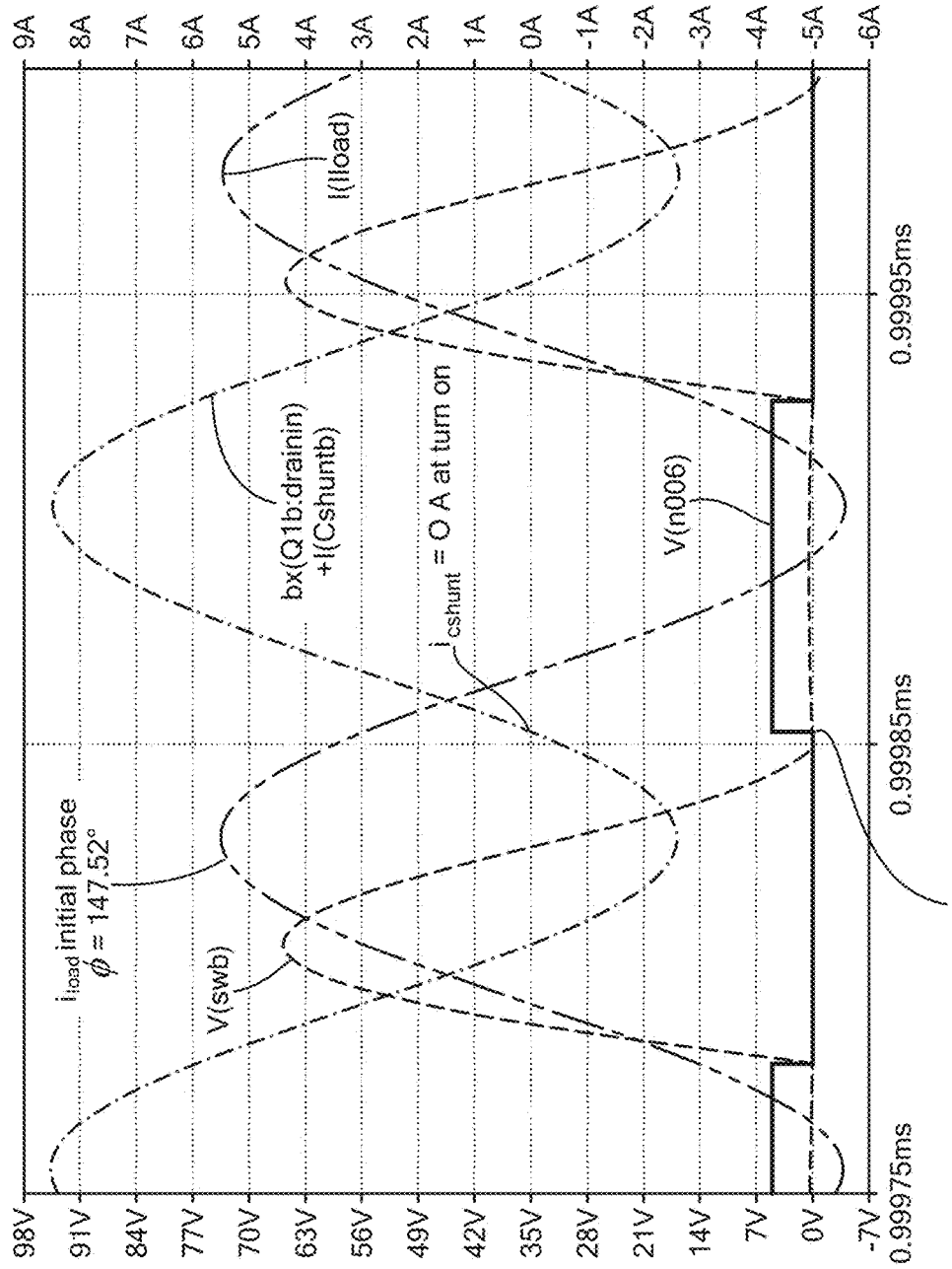
FIG. 5 is a waveform diagram of load current, shunt current, and drain voltage.

FIG. 5 shows example waveforms for load current $I_{load}$, shunt current $I_{C_{Shunt}}$, and voltage $v_{ds}$ for the circuit of FIG. 4. The initial phase φ for the load current $I_{load}$ is 147.52° with respect to the gate drive waveform in the illustrated embodiment. As shown, the drain voltage is 0V and the shunt current $I_{C_{shunt}}$ is 0A at turn on. It is understood that the $I_{C_{shunt}}$ waveform represents the current flowing from node $Sw_a$ down to ground through $Q_{1a}$ and $C_{shunta}$.

In general, a nominal class E drain waveform has low FET switching loss. The drain voltage at turn on $v_{ds}(2\pi)=0V$ for zero voltage switching and the slope of the drain voltage at turn on $$\frac{dv_{ds}(2\pi)}{d(\omega t)} = 0 \frac{v}{\text{rad}}.$$

Since the FET is parallel with a capacitor, this means there is zero current switching loss. Simplifying the DC voltage source, $V_{Bus}$, and the RF choke as a DC current source, $I_{Bus}$, and the load impedance as an AC current sink, $i_{load}$, with a predefined initial phase, when the FET is off:

$$i_{Cshunt} = I_{Bus} - i_{load} = I_{Bus} - I_{load}\sin(\omega t + \varphi)$$

$$i_{Cshunt}(2\pi) = 0A = I_{Bus} - I_{load}\sin\varphi \rightarrow I_{Bus} = I_{load}\sin\varphi$$

$$v_{ds} = \frac{1}{\omega C_{shunt}}\int_\pi^{\omega t}[I_{Bus} - I_{load}\sin(\omega t + \varphi)]d(\omega t)$$

$$v_{ds} = \frac{1}{\omega C_{shunt}}(I_{Bus}(\omega t - \pi) + I_{load}(\cos(\omega t + \varphi) + \cos\varphi))$$

$$v_{ds}(2\pi) = 0V = \frac{1}{\omega C_{shunt}}(\pi I_{Bus} + 2I_{load}\cos\varphi)\pi I_{Bus} = 2I_{load}\cos\varphi \rightarrow I_{load} =$$

$$\frac{-\pi I_{Bus}}{2\cos\varphi}I_{Bus} = \frac{-\pi I_{Bus}}{2\cos\varphi}\sin\varphi \rightarrow \frac{-\pi\sin\varphi}{2\cos\varphi} = 1 \rightarrow \tan\varphi =$$

$$\frac{-2}{\pi}v_{ds} = \frac{I_{Bus}}{\omega C_{shunt}}\left((\omega t - \pi) - \frac{\pi}{2\cos\varphi}(\cos(\omega t + \varphi) + \cos\varphi)\right)$$

$$v_{ds} = \frac{I_{Bus}}{\omega C_{shunt}}\left(\omega t - \frac{3\pi}{2} - \frac{\pi}{2\cos\varphi}\cos(\omega t + \varphi)\right)$$

where φ represents the phase of the load current $i_{load}$ with respect to gate drive.

Since the DC component across the input RF choke $L_{rfca}$ (FIG. 4) is 0, the voltage $V_{Bus}$ is the average value of $v_{ds}$:

$$V_{Bus} = \frac{1}{2\pi}\int_\pi^{2\pi}v_{ds}d(\omega t) =$$

$$\frac{1}{2\pi}\int_\pi^{2\pi}\frac{I_{Bus}}{\omega C_{shunt}}\left[\omega t - \frac{3\pi}{2} + \frac{-\pi}{2\cos\varphi}\cos(\omega t + \varphi)\right]d(\omega t)$$

$$V_{Bus} = \frac{I_{Bus}}{\pi\omega C_{shunt}}$$

$$I_{Bus} = V_{Bus}\pi\omega C_{shunt}$$

$$X_{C_{Shunt}} = \frac{1}{\omega C_{shunt}} = \frac{\pi V_{Bus}}{I_{Bus}} = \frac{\pi V_{Bus}^2}{P_{Bus}}$$

Assuming negligible losses, $$X_{C_{Shunt}} = \frac{1}{\omega C_{shunt}} = \frac{\pi V_{Bus}^2}{P_{Load}}$$

In embodiments, a high Q LC notch filter in series with the load allows one to assume that the load admittance at harmonic frequencies is negligible. It should be noted that the implemented LCL impedance matching network topology, 204 (FIG. 2) and FIG. 6, may have similar harmonic rejection to the series LC notch filter shown in FIG. 4. This allows analysis of the load network to be reduced to the fundamental frequency impedance, which in the case of the nominal class E where the load current $i_{load}$, which lags the drain voltage $v_{ds}$, is inductive. Using the known nominal $v_{ds}$ waveform, the voltages across the reactive, $v_{Lb}$, and real, $v_{Rload}$, components of the load impedance can be derived. These voltages in combination with load current can allow the load impedances to be derived.

The fundamental real load for a nominal class E amplifier can be determined as follows:

$$v_{ds,1} = v_{Rload,1} + v_{Lb,1} = V_{Rload,m} \sin(\omega t + \varphi) + V_{Lb,m} \cos(\omega t + \varphi)$$

$$V_{Rload,m} = \frac{1}{\pi} \int_{\pi}^{2\pi} v_{ds} \sin(\omega t + \varphi) d(\omega t)$$

$$V_{Rload,m} =$$

$$\frac{1}{\pi} \int_{\pi}^{2\pi} \frac{I_{Bus}}{\omega C_{shunt}} \left[ \omega t - \frac{3\pi}{2} - \frac{\pi}{2\cos\varphi} \cos(\omega t + \varphi) \right] \sin(\omega t + \varphi) d(\omega t)$$

$$V_{Rload,m} = \frac{4V_{Bus}}{\sqrt{\pi^2 + 4}} \quad R_{load} = \frac{V_{Rload,m}^2}{2P_{load}} = \frac{8V_{Bus}^2}{P_{load}(\pi^2 + 4)}$$

The nominal class E fundamental reactive load voltage can be determined as set forth below:

$$v_{ds,1} = v_{Rload,1} + v_{Lb,1} = V_{Rload,m} \sin(\omega t + \varphi) + V_{Lb,m} \cos(\omega t + \varphi)$$

$$V_{Lb,m} = \frac{1}{\pi} \int_{\pi}^{2\pi} v_{ds} \cos(\omega t + \varphi) d(\omega t)$$

$$V_{Lb,m} = \frac{1}{\pi} \int_{\pi}^{2\pi} \frac{I_{Bus}}{\omega C_{shunt}} \left[ \omega t - \frac{3\pi}{2} - \frac{\pi}{2\cos\varphi} (\omega t + \varphi) \right] \cos(\omega t + \varphi) d(\omega t)$$

$$V_{Lb,m} =$$

$$\frac{1}{\pi} \int_{\pi}^{2\pi} \frac{V_{Bus}\pi\omega C_{shunt}}{\omega C_{shunt}} \left[ \omega t - \frac{3\pi}{2} - \frac{\pi}{2\cos\varphi} \cos(\omega t + \varphi) \right] \cos(\omega t + \varphi) d(\omega t)$$

$$V_{Lb,m} = V_{Bus} \left( \frac{\pi(\pi^2 - 4)}{4\sqrt{\pi^2 + 4}} \right)$$

$$\omega L_b =$$

$$\frac{V_{Lb,m}}{I_{load}} = \frac{V_{Bus}\left(\frac{\pi(\pi^2-4)}{4\sqrt{\pi^2+4}}\right)}{\frac{-\pi I_{Bus}}{2\cos\varphi}} = \frac{V_{Bus}\left(\frac{\pi(\pi^2-4)}{4\sqrt{\pi^2+4}}\right)}{\frac{\pi V_{Bus}\omega C_{shunt}\sqrt{\pi^2+4}}{2}} = \frac{(\pi^2-4)}{2\omega C_{shunt}(\pi^2+4)}$$

Using the above, the fundamental class E drain voltage $v_{ds}$ can be determined as:

$$v_{ds,1} = v_{Rload,1} + v_{Lb,1} = V_{ds,1} \sin(\omega t + \theta)$$

$$v_{ds,1} = V_{Rload,m} \sin(\omega t + \varphi) + V_{Lb,m} \cos(\omega t + \varphi)$$

$$V_{ds,1} = \sqrt{(\omega L_b I_{load})^2 + (R_{load}I_{load})^2} = \sqrt{V_{Rload,m}^2 + V_{Lb,m}^2}$$

$$V_{ds,1} = \sqrt{\left(V_{Bus}\left(\frac{\pi(\pi^2-4)}{4\sqrt{\pi^2+4}}\right)\right)^2 + \left(\frac{4V_{Bus}}{\sqrt{\pi^2+4}}\right)^2} \quad 1.639 V_{Bus}$$

It is understood that $$\frac{V_{ds,1}}{V_{Bus}} = 1.639$$

is the analytical ideal ratio of fundamental drain voltage to bus voltage for a class E amplifier. With a differential push-pull class E amplifier shown in FIG. 6, the $v_{ds}$ waveform is replicated across Q1b 180° out of phase with the $v_{ds}$ across Q1a, which means $$\frac{V_{ds,1}}{V_{Bus}} = 2 * 1.639$$

for a differential push-pull class E amplifier. With nonlinear FET Coss and nonsinusoidal $i_{load}$, the ratio $$\frac{V_{ds,1}}{V_{Bus}}$$

can be lower for the $$v_{ds}(2\pi) = 0V \text{ and } \frac{dv_{ds}(2\pi)}{d(\omega t)} = 0 \frac{V}{\text{rad}}.$$

With an LCL matching network, using a Norton equivalent circuit shows:

$$V_{ds,1} = \frac{X_0 I_{coil,1}}{2} = \frac{X_0 I_{coil}}{\sqrt{2}}$$

Since coil current, $I_{coil}$, and bus voltage, $V_{Bus}$, are already measured, these can be used for feedback to adjust $X_{C1}$ to maintain the ratio $$\frac{V_{ds,1}}{V_{Bus}}.$$

Figure 6:
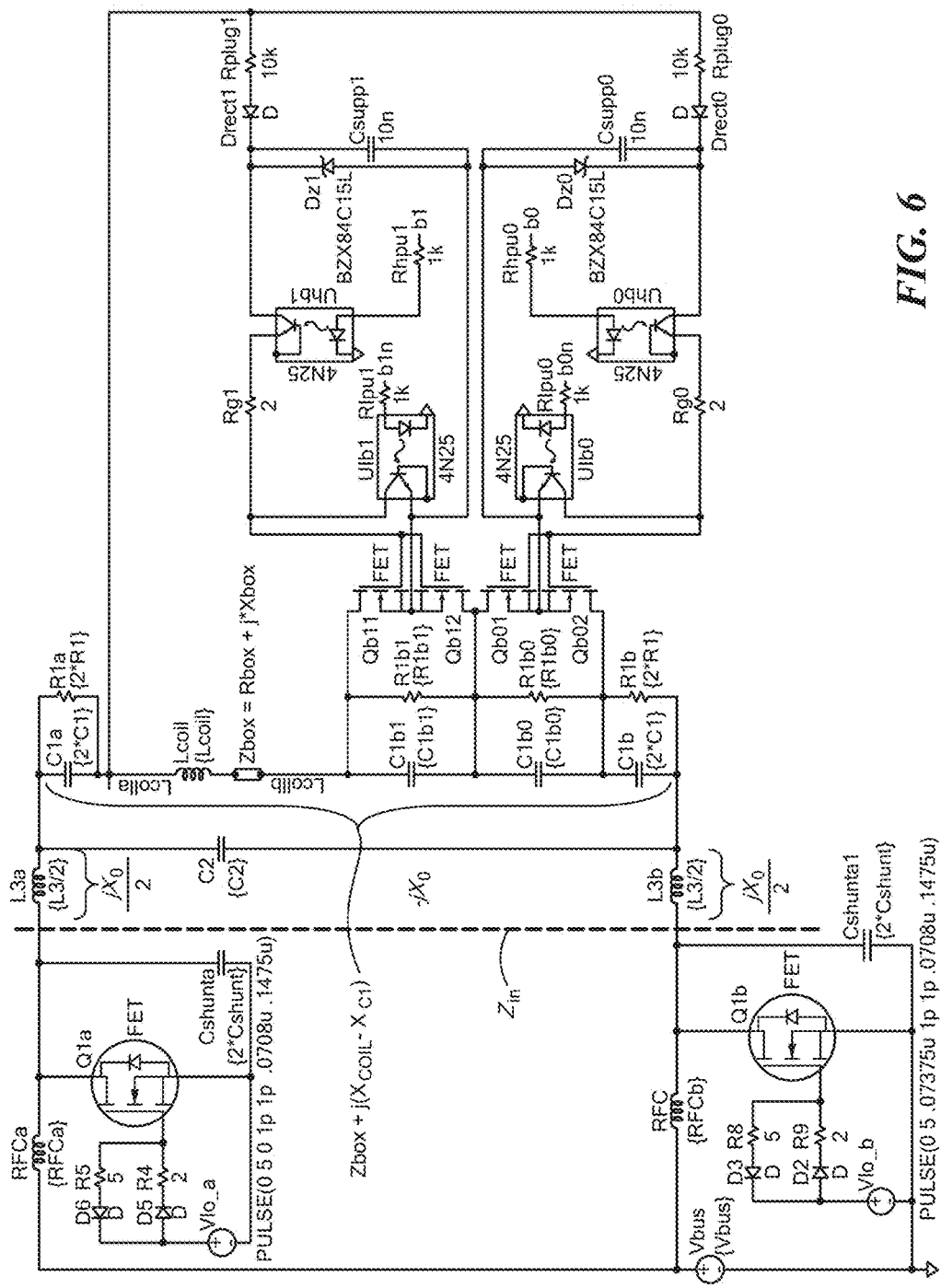
FIG. 6 is an example circuit diagram of a class E amplifier with a dynamic impedance matching network.

Before discussing this ratio further, an example equivalent circuit derivation is provided. FIG. 6 shows first and second switching elements $Q_{1a}$, $Q_{1b}$ forming first and second class E amplifiers to energize a load. Coupled in series across the switching elements $Q_{1a}$, $Q_{1b}$ are inductor $L_{3a}$, capacitor $C_{1a}$, resonator coil $L_{coil}$, $Z_{BOX}$, capacitor bank $C_{1b1}$, $C_{1b0}$, $C_{1b}$, and inductor $L_{3a}$. As discussed more fully below, the capacitor bank enables load impedance change compensation by switching capacitors in and out based upon feedback associated with the ratio $$\frac{V_{ds,1}}{V_{Bus}}.$$

For $Z_1=Z_1+j(X_{coil}-X_{C1})$ (FIG. 6), the LCL Norton equivalent circuit can be derived as shown below. The class E amplifier circuitry at the input of the LCL is replaced with an ideal AC source $2V_{ds,1}$ at the fundamental frequency.

1. Short $Z_1$ and solve for $I_{in,1}$ $$I_{in,1} = \frac{2V_{ds,1}}{jX_0}.$$

2. Short $2V_{ds,1}$ and solve for $Z_\|$ $$Z_\| = \frac{(-jX_0)(jX_0)}{jX_0 - jX_0} = \inf.$$

3. Replace circuitry connected to $Z_1$ with a current source equal to $I_{in}$ and a parallel impedance $Z_\|$ $$I_{in,1} = I_{coil,1} = \frac{2V_{ds,1}}{jX_0} \rightarrow \frac{jX_0 I_{coil,1}}{2} = V_{ds,1}.$$

It is understood that $2V_{ds,1}$ is for a differential push-pull class E amplifier. Each class E amplifier provides half the amplitude, $V_{ds,1}$, of the fundamental component of the voltage into the LCL, $2V_{ds,1}$. This conversion moves from the single ended analysis used to derive the ideal $$\frac{V_{ds,1}}{V_{Bus}}$$

to example embodiments of a differential dual class E circuitry. It is further understood that this analysis applies to the amplitude of the fundamental components of the coil current, $I_{coil,1}$.

Figure 7:
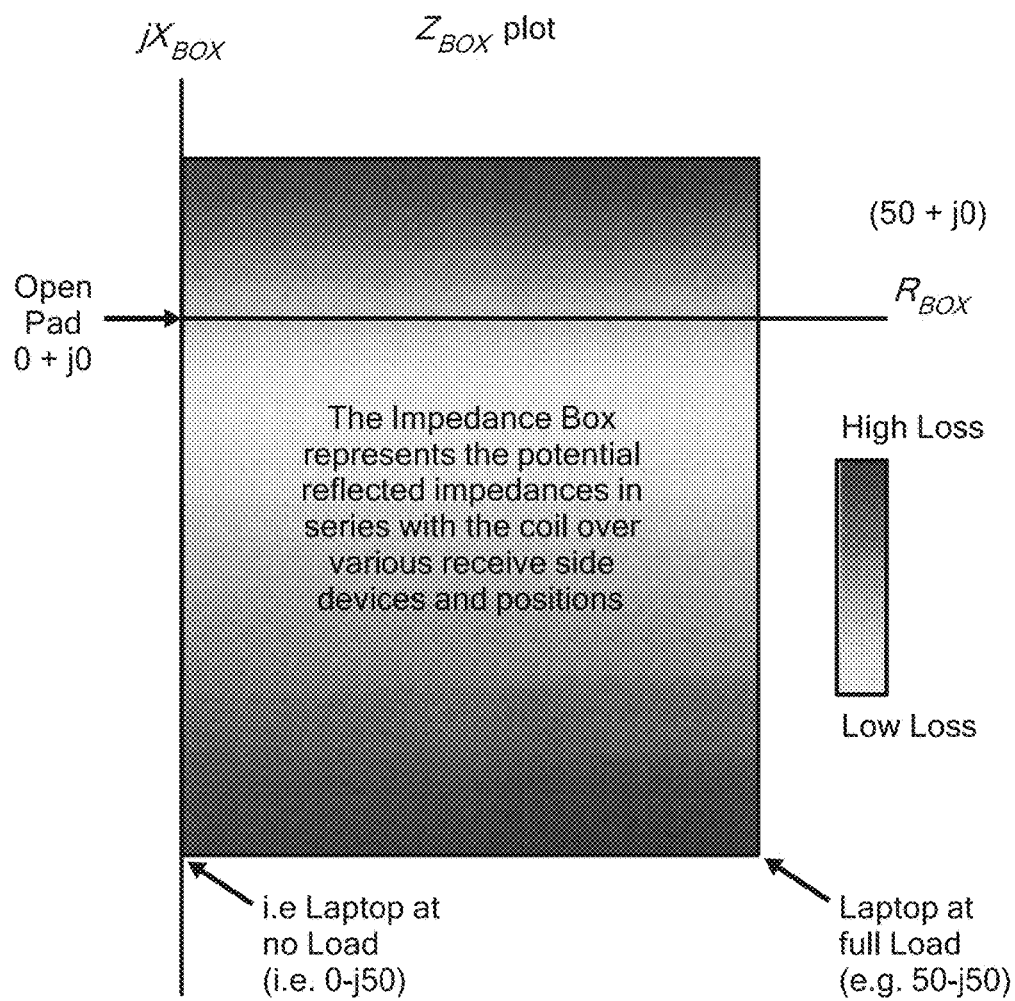
FIG. 7 is a schematic representation of an impedance box for power receivers in relation to a power transmitter.

FIG. 7 shows an example $Z_{BOX}$ representation corresponding to the scenario of FIG. 2. As a receiver is placed on or around a transmitter, load impedance can change. The $Z_{BOX}$ representation shows potential reflected impedances in series with the resonator coil $L_{coil}$ over various receiver positions. For example, an open pad (no receiver on pad of transmitter) can be represented as 0+j0. An electronic device, such as a laptop, being charged near a maximum level can be represented as 50−j50.

The LCL input impedance including the $Z_{BOX}$ values can be derived as follows:

$$Z_{in} = \frac{2jX_0}{2} + \frac{-jX_0(Z_{BOX} + j(X_{COIL} - X_{C1}))}{-jX_0 + Z_{BOX} + j(X_{COIL} - X_{C1})}$$

$$Z_{in} = \frac{X_0^2}{R_{BOX} + j(X_{COIL} + X_{BOX} - X_{C1} - X_0)} =$$

$$\frac{X_0^2(R_{BOX} - j(X_{COIL} + X_{BOX} - X_{C1} - X_0))}{R_{BOX}^2 + (X_{COIL} + X_{BOX} - X_{C1} - X_0)^2}$$

As noted above, $I_{coil}$ and bus voltage $V_{Bus}$ can be measured to generate a feedback signal for adjusting $X_{C1}$ to maintain the ratio $$\frac{V_{ds,1}}{V_{Bus}}.$$

Figure 8A:
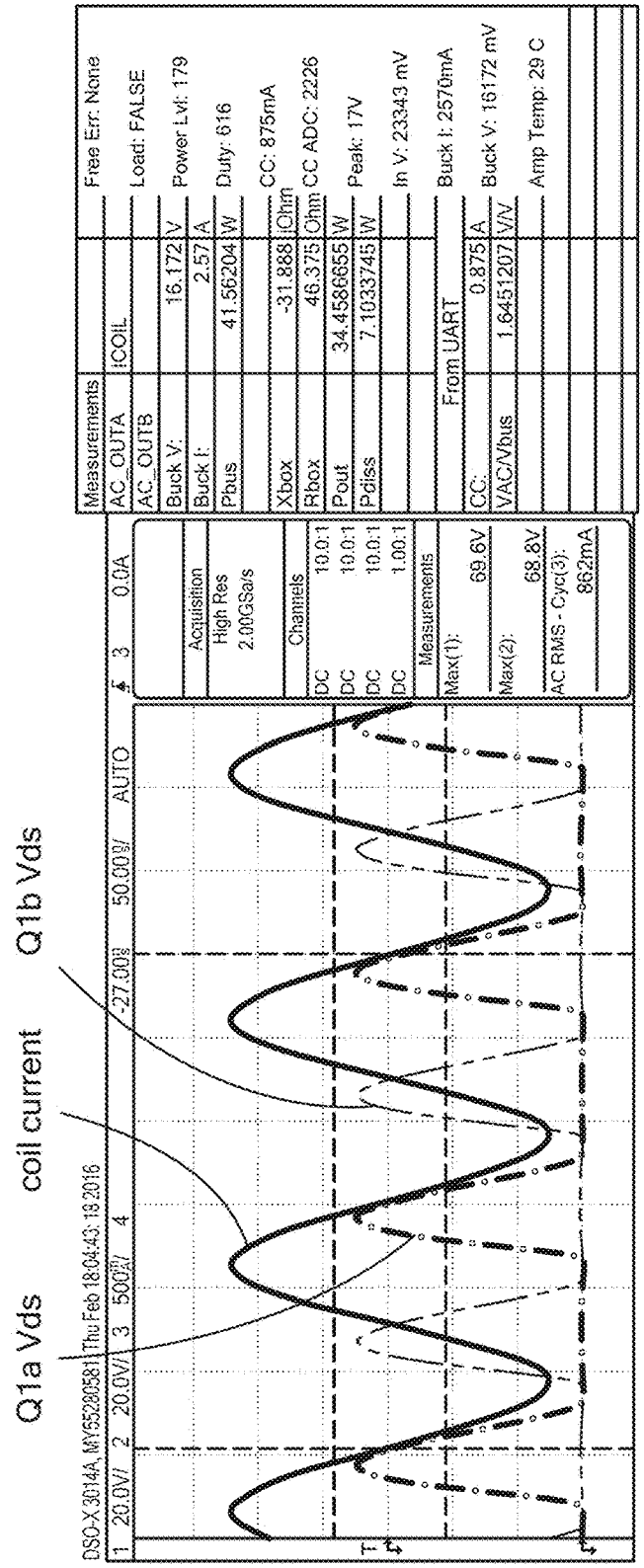
FIGS. 8A-8C are waveform diagrams for coil current and drain current for amplifier switching devices for various impedance box values.
Figure 8B:
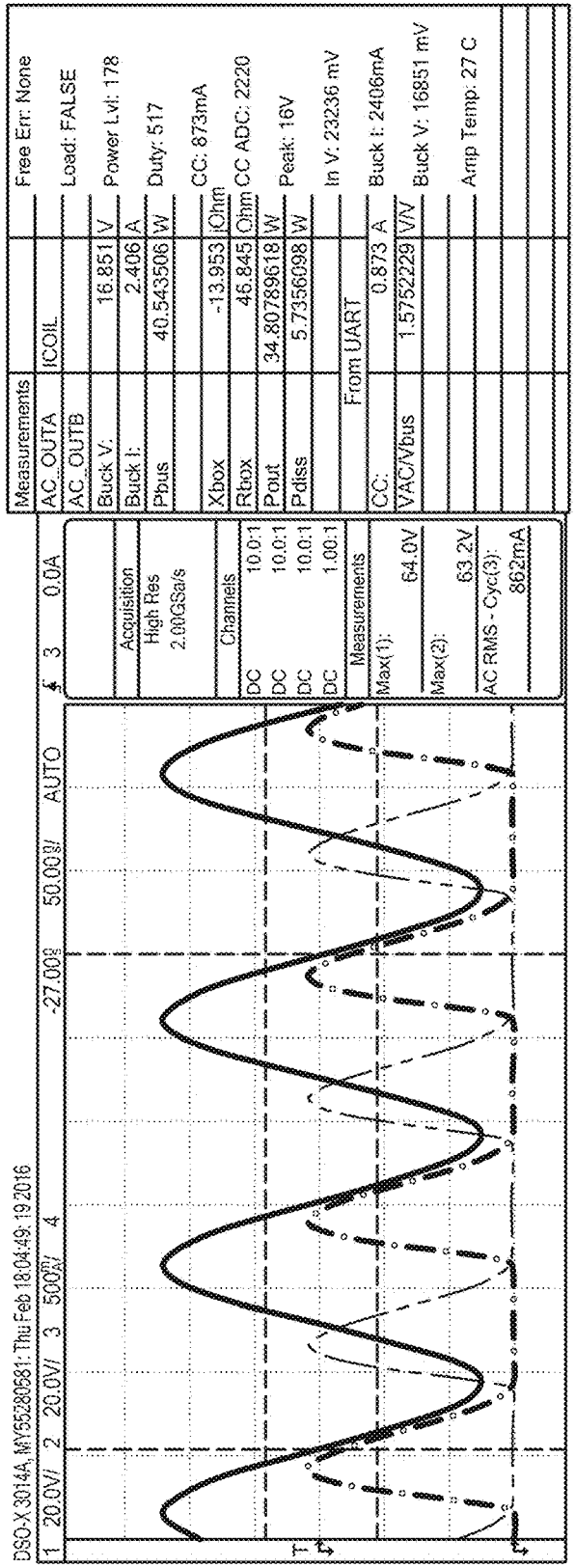
Figure 8C:
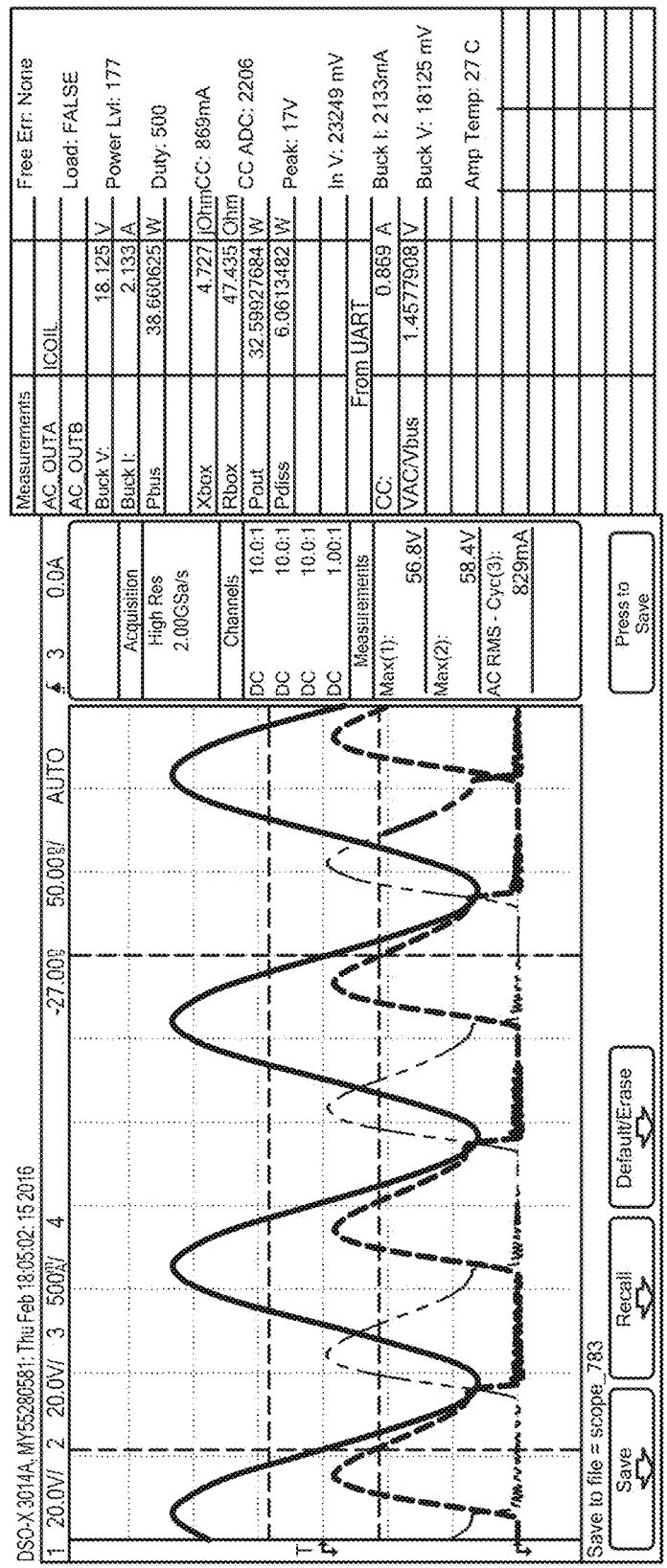

It should be noted that one can set the real and imaginary components of the input impedance of the LCL equal to the real and imaginary components of the input impedance of the RLC from derivation associated with FIG. 4. FIGS. 8A-8C show waveforms for the drain voltages for $Q_{1a}$, $Q_{1b}$ (FIG. 6) and coil current $I_{coil}$. FIG. 8A shows a scenario associated with excessive reactive current and less than optimal power dissipation due to excessive conduction loss, FIG. 8B shows generally preferred zero voltage switching (ZVS) and zero derivative switching (ZDS) at turn on, and FIG. 8C shows so-called hard switching that yields higher power dissipation. The power dissipations for FIGS. 8A, 8B, and 8C are shown as 7.1 W, 5.7 W, and 6.0 W respectively. Various $X_{BOX}$ and $R_{BOX}$ values are also shown.

$$\frac{V_{ds,1}}{V_{Bus}}$$

ratios are also shown as 1.64, 1.57, and 1.45, respectively.

Figure 9:
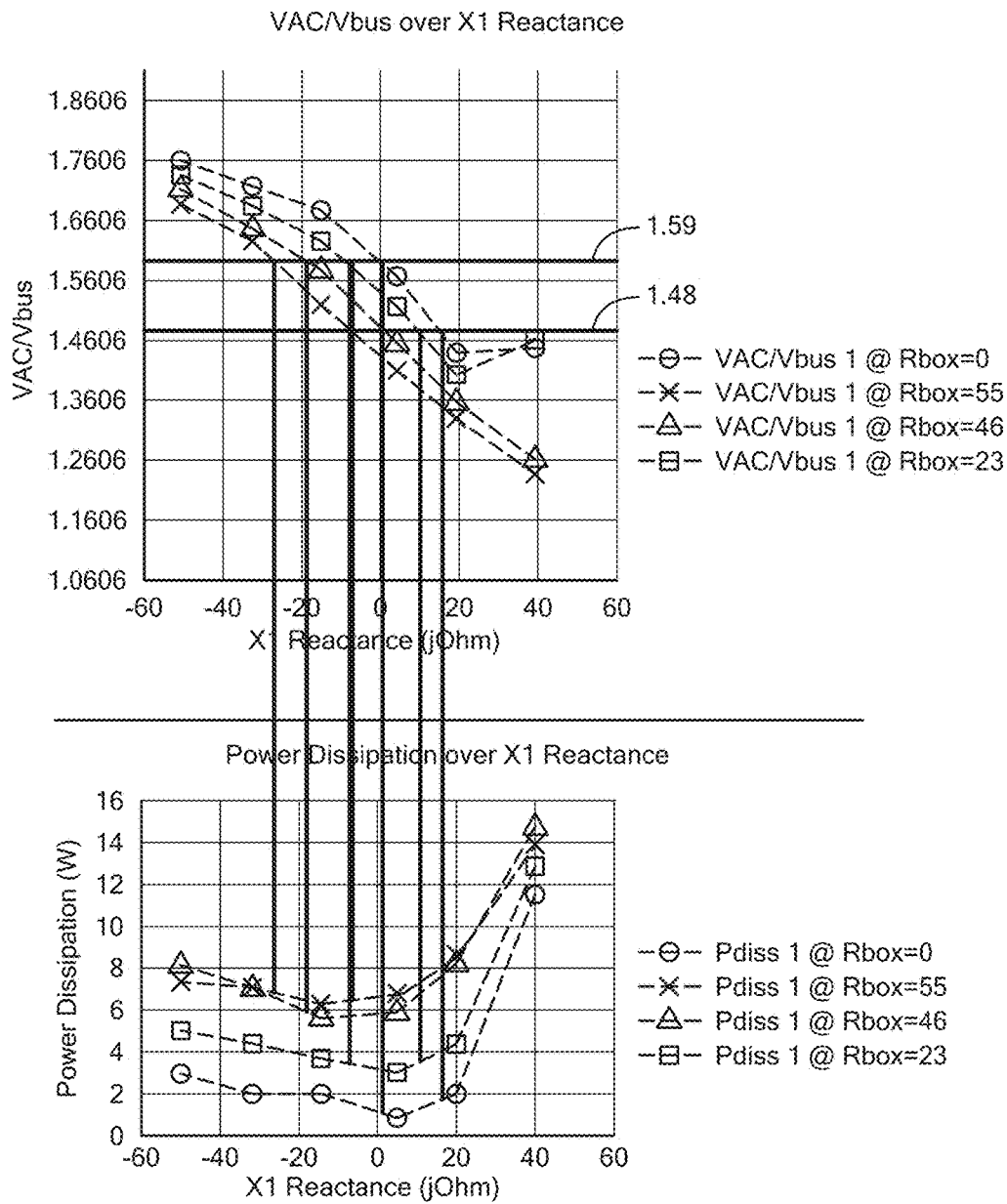
FIG. 9 shows graphical representations of drain voltage over reactance and power dissipation over reactance, e.g., the ratio of fundamental drain voltage to bus voltage.

FIG. 9 shows data was collected over varying impedance box loads (Rbox) for $$\frac{V_{ds,1}}{V_{Bus}}$$

and for dissipated power. It was found that $$\frac{V_{ds,1}}{V_{Bus}}$$

ratio boundaries of 1.59 and 1.48 yielded the lowest losses for the resistive components of the impedance box. It can be seen that by adjusting the $X_1$ reactance using coil current $I_{coil}$ and voltage $V_{Bus}$ as feedback, the $$\frac{V_{ds,1}}{V_{Bus}}$$

ratio can be maintained to promote low power dissipation in the amplifier switching elements.

Figure 10A:
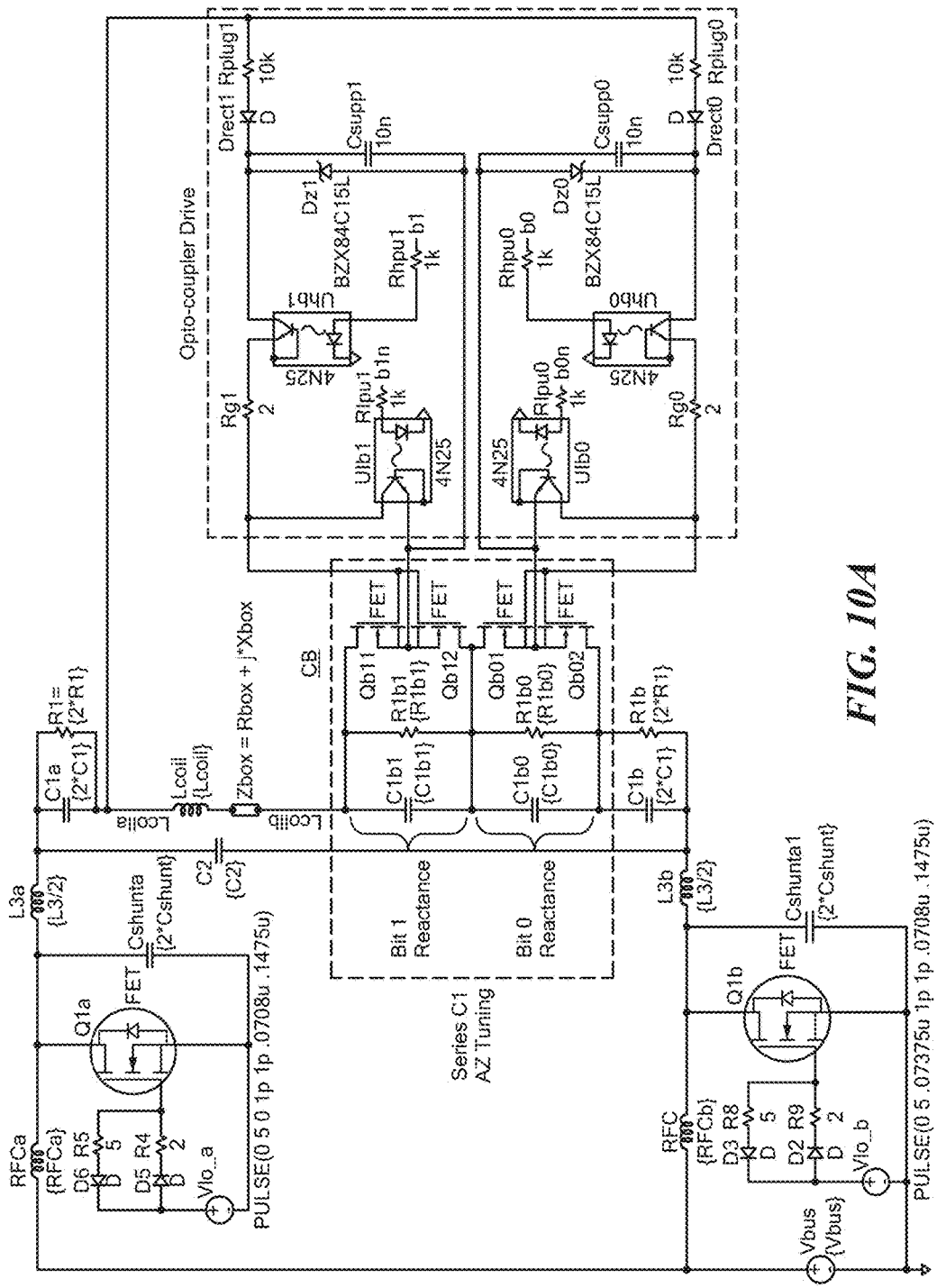
FIGS. 10A-C are diagrams showing an example reactance compensation circuit for an amplifier driving an impedance matching network.
Figure 10B:
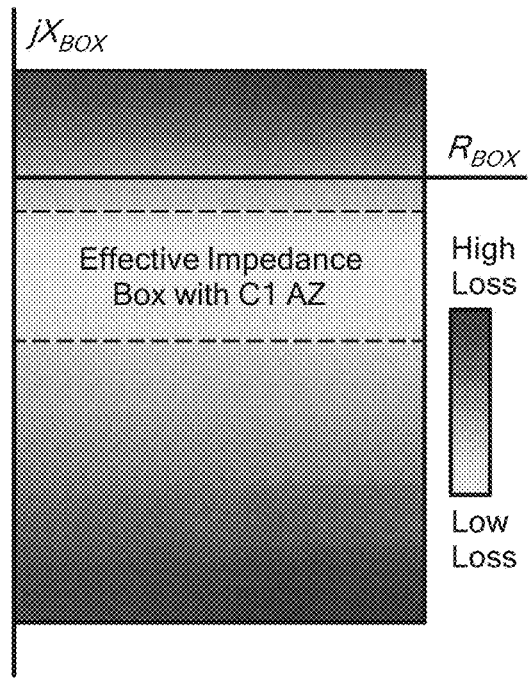
Figure 10C:
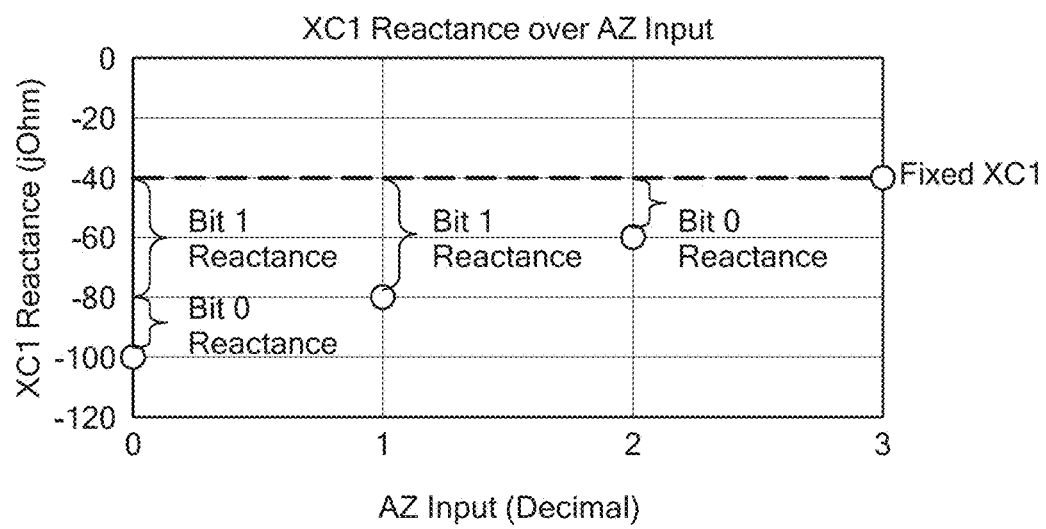

FIG. 10 shows an example embodiment of a system having impedance tuning in accordance with example embodiments of the invention. FIG. 10 has some commonality with FIG. 6 with further detail of $X_{C1}$ reactance. It is understood that AZ refers to "adaptive impedance" or "adjustable impedance", for example, of capacitor $C_1$. As described above, it is desirable to maintain $$\frac{V_{ds,1}}{V_{Bus}}$$

ratio within certain boundary values to minimize power dissipation in the class E switching elements. By switching in and out capacitors in the capacitor bank $X_B$, $X_{C1}$ reactance can be adjusted. The measured bus voltage $V_{Bus}$ and the measured coil current $I_{coil}$ can be used to derive the drain voltage $$\left(\frac{X_0 I_{coil}}{\sqrt{2}} = V_{ds,1}\right).$$

In the illustrated embodiment, based upon the measured values for the feedback signal, a digital value can correspond to various $X_{C1}$ reactances. For example, bit 0 can correspond to a change from a fixed reactance value of −40 to about −60, bit 1 can correspond to a change from −40 to about −80, and both bits correspond to a change to −100 jOhm. With this arrangement, the capacitors can be switched in and out to maintain the desired $$\frac{V_{ds,1}}{V_{Bus}}$$

ratio for reducing power dissipation.

While an opto-coupler based capacitor bank is shown, it is understood that any suitable tuning mechanism, such as pulse width modulation (PWM) component switching, can be used to compensate for impedance changes.

Figure 11:
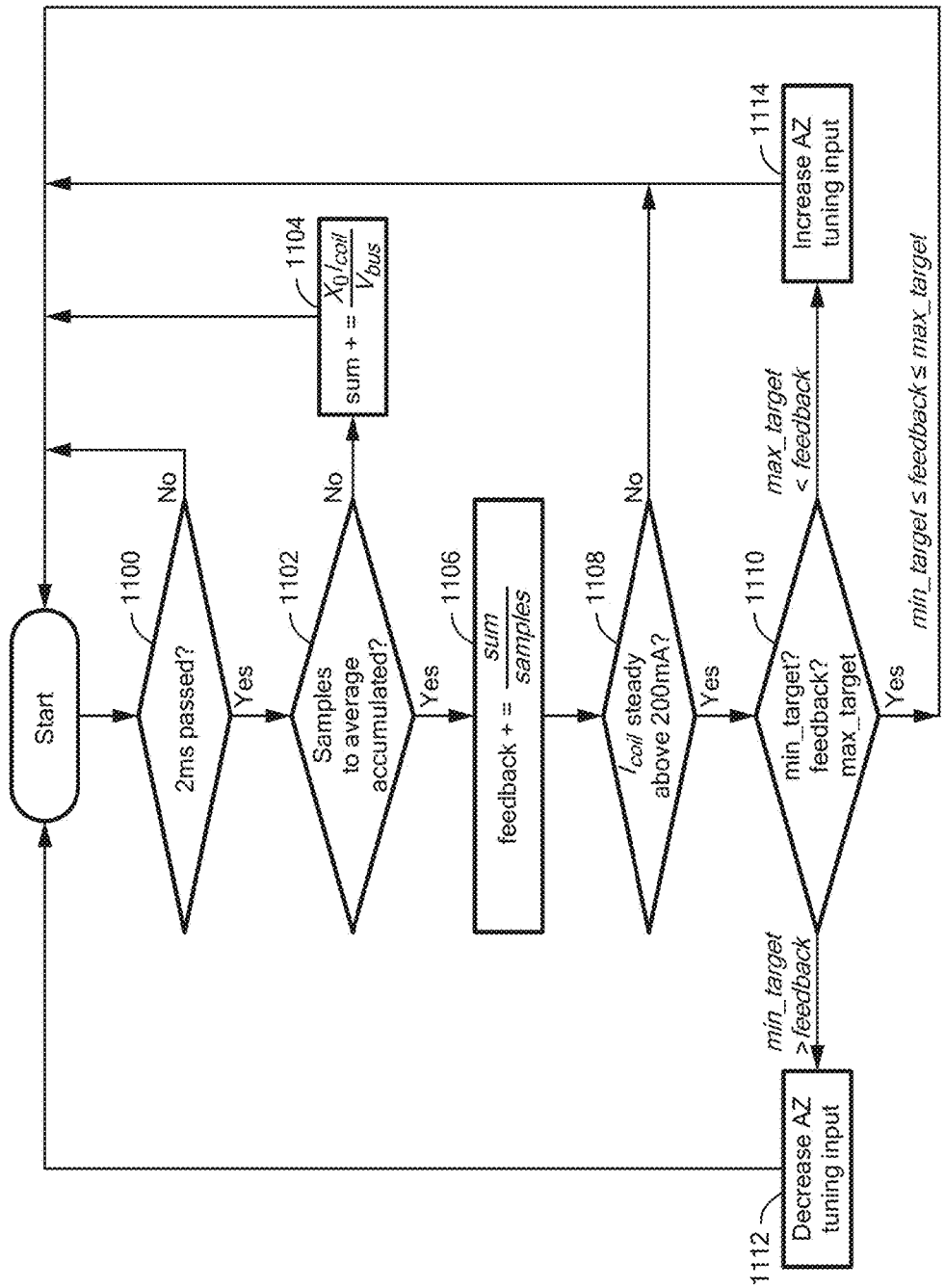
FIG. 11 is a flow chart showing an example sequence of steps for providing DC input voltage to fundamental AC drain voltage gain regulation for an impedance matching network.

FIG. 11 shows an illustrative sequence of steps for providing drain voltage regulation in accordance with example embodiments of the invention. In step 1100, it is determined whether some amount of time, e.g., 2 ms has passed. This amount of time may be determined or limited by the latency of the current measurement and/or controller circuitry. If so, in step 1102 it is determined whether a given number of signal samples have accumulated for averaging. If not, in step 1104, the bus voltage $V_{Bus}$ and voltage as $X_0 I_{coil}$ which is an indirect measurement of $V_{ds,1}$, are sampled and summed. If a given number of samples were accumulated, the sum computed in step 1104, is divided by the number of samples to determine the $$\frac{V_{ds,1}}{V_{Bus}}$$

ratio, which can provide a feedback signal in step 1106. In step 1108, the system confirms that the coil current $I_{coil}$ is above a selected threshold, such as 200 mA. In step 1110, the feedback signal is evaluated against a minimum target value and a maximum target value. If the feedback signal is less than the minimum target value, impedance tuning is decreased in step 1112. If the feedback signal is greater than the maximum target value, then impedance tuning is increased in step 1114. If the feedback signal is between the minimum and maximum target values, than processing continues and more signal samples are collected.

While example embodiments of the invention are shown and described in conjunction with class E amplifiers, it is understood that other classes of amplifiers can be used, such as current fed Class D, Class DE and Class F amplifiers having a $V_{ds,1}$ to $V_{bus}$ ratio that can be regulated with AZ and/or other indirect feedback mechanisms. In general, such amplifiers have a $V_{ds,1}$ that varies with load impedance. It is further understood that any practical technique for determining the fundamental component of the amplifier's output voltage can be used to meet the needs of a particular application. For example, in embodiments mixers or passive bandpass filtering may be used to determine the fundamental component of amplifier output voltage. In embodiments, one or more mixers and/or bandpass filters can be used to directly measure the fundamental component of amplifier output voltage.

Figure 12:
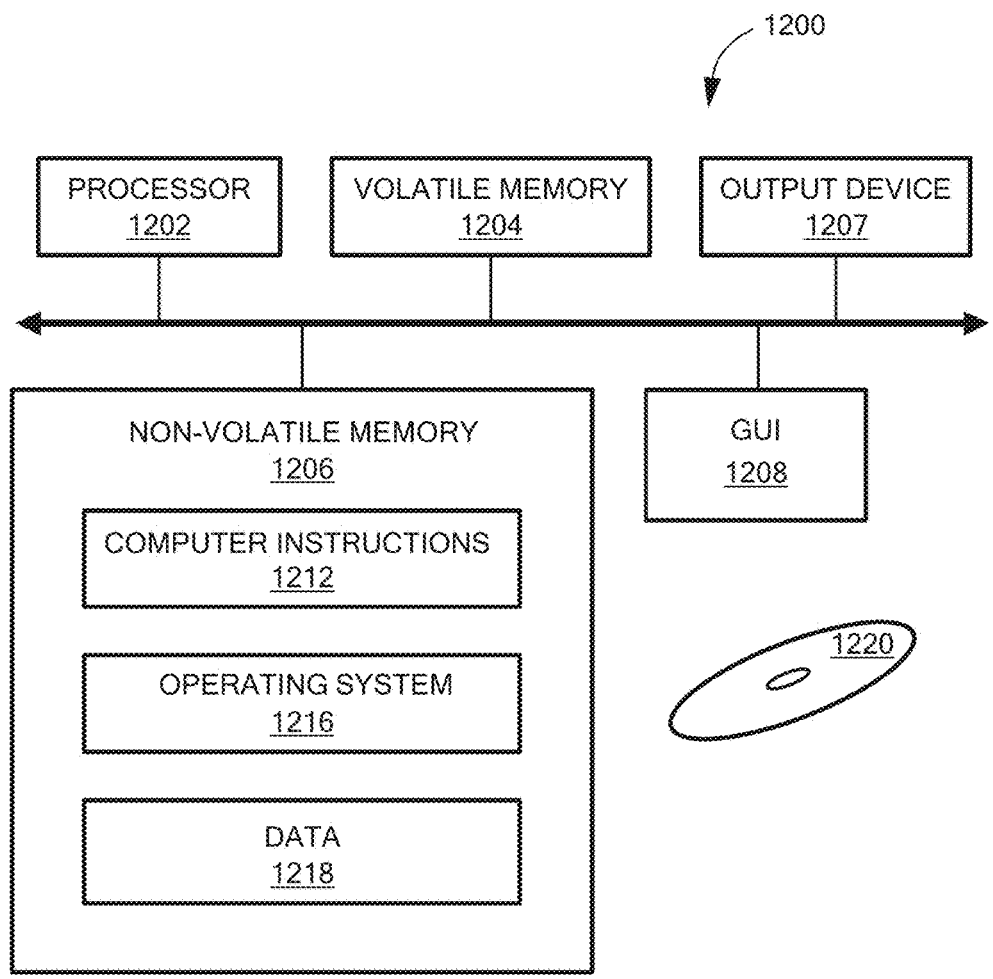
FIG. 12 shows a schematic representation of an illustrative computer that can perform at least a portion of the processing described herein.

FIG. 12 shows an exemplary computer 1200 that can perform at least part of the processing described herein. The computer 1200 includes a processor 1202, a volatile memory 1204, a non-volatile memory 1206 (e.g., hard disk), an output device 1207 and a graphical user interface (GUI) 1208 (e.g., a mouse, a keyboard, a display, for example). The non-volatile memory 1206 stores computer instructions 1212, an operating system 1216 and data 1218. In one example, the computer instructions 1212 are executed by the processor 1202 out of volatile memory 1204. In one embodiment, an article 1220 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. All publications and references cited herein are expressly incorporated herein by reference in their entirety. Elements of different embodiments described herein may be combined to form other embodiments not specifically set forth above. Various elements, which are described in the context of a single embodiment, may also be provided separately or in any suitable subcombination.

What is claimed is:
1. A method comprising:
    compensating for impedance changes in a network to energize a load, wherein the network is coupled to an amplifier which has a fundamental AC output voltage that varies with the load impedance of the amplifier, by:

determining a feedback signal from a ratio of a bus voltage and the amplifier fundamental AC output voltage, wherein the bus voltage corresponds to a voltage driving the amplifier and the amplifier fundamental AC output voltage corresponds to a fundamental component of voltage input to a load of the amplifier; and
adjusting impedance of one or more components in the network based on the feedback signal.

2. The method according to claim 1, where the amplifier fundamental AC output voltage is determined from a measurement of current to the load, wherein the load is coupled to the amplifier by an LCL impedance matching network.

3. The method according to claim 1, further including directly measuring the amplifier fundamental AC output voltage.

4. The method according to claim 3, where the amplifier fundamental AC output voltage is determined using at least one of a mixer or a bandpass filter.

5. The method according to claim 1, wherein the load includes a resonator having a coil.

6. The method according to claim 5, wherein the network includes at least one capacitor coupled to the coil of the resonator.

7. The method according to claim 5, wherein the network comprises an impedance matching network coupled to the coil.

8. The method according to claim 1, further including maintaining a given ratio of the bus voltage and amplifier fundamental AC output voltage based on the feedback signal.

9. The method according to claim 1, further including maintaining a given ratio of the bus voltage and amplifier fundamental AC output voltage within a range based on the feedback signal.

10. The method according to claim 9, wherein the range includes a minimum value and a maximum value, and further including decreasing an impedance in the network when the feedback signal is less than the minimum value and increasing an impedance in the network when the feedback signal is above the maximum value.

11. The method according to claim 1, wherein adjusting impedance of one or more components in the network based on the feedback signal includes controlling a capacitor bank based on the feedback signal.

12. The method according to claim 1, wherein the amplifier comprises at least one class E amplifier.

13. The method according to claim 1, wherein the load includes a resonator having a source coil, wherein resonator impedance changes in response to proximity of a device having a device resonator coil.

14. A system, comprising:
a network configured for energizing a load;
an amplifier coupled to the network; and
a processor to compensate for impedance changes in the network based upon a feedback signal determined from a ratio of a bus voltage and a fundamental AC output voltage of the amplifier, wherein the bus voltage corresponds to a voltage driving the amplifier and the amplifier fundamental AC output voltage corresponds to a fundamental component of voltage input to a load of the amplifier.

15. The system according to claim 14, where the amplifier fundamental AC voltage output is determined from a measurement of the current to the load, wherein the load is coupled to the amplifier by an LCL impedance matching network.

16. The system according to claim 14, wherein the network comprises an impedance matching network coupled to a coil.

17. The system according to claim 14, wherein the processor is configured to maintain a given ratio of the bus voltage and the amplifier fundamental AC output voltage within a range based on the feedback signal.

18. The system according to claim 14, further including a capacitor bank, wherein compensating for the impedance changes includes controlling the capacitor bank based on the feedback signal.

19. The system according to claim 14, wherein the amplifier includes at least one class-E amplifier.

20. The system according to claim 14, wherein the load includes a resonator having a source coil, wherein resonator impedance changes in response to proximity of a device having a device resonator coil.

21. An article, comprising:
a non-transitory computer readable medium containing stored instructions that enable a machine to:
compensate for impedance changes in a network that includes a load, wherein the network is configured for coupling to an amplifier which has a fundamental AC output voltage that varies with the load impedance of the amplifier, by:
determining a feedback signal from a ratio of a bus voltage and the amplifier fundamental AC output voltage, wherein the bus voltage corresponds to a voltage driving the amplifier and the amplifier fundamental AC output voltage corresponds to a fundamental component of voltage input to a load of the amplifier; and
generating one or more signals to adjust impedance of one or more components in the network based on the feedback signal.

22. The article of claim 21, where the amplifier fundamental AC output voltage is determined from a measurement of current to the load, wherein the load is coupled to the amplifier by an LCL impedance matching network.

23. The article of claim 21, further including maintaining a given ratio of the bus voltage and amplifier fundamental AC output voltage based on the feedback signal.

24. A method comprising:
compensating for impedance changes in a network to energize a load, wherein the network is coupled to an amplifier which has a fundamental AC output voltage that varies with the load impedance of the amplifier, by:
determining a feedback signal based on a bus voltage and the amplifier fundamental AC output voltage, wherein the bus voltage corresponds to a voltage driving the amplifier and the amplifier fundamental AC output voltage corresponds to a fundamental component of voltage input to a load of the amplifier;
maintaining a given ratio of the bus voltage and amplifier fundamental AC output voltage within a range based on the feedback signal, wherein the range includes a minimum value and a maximum value;
decreasing an impedance in the network when the feedback signal is less than the minimum value; and
increasing an impedance in the network when the feedback signal is above the maximum value.

25. The method according to claim 24, wherein the amplifier fundamental AC output voltage is determined from a measurement of current to the load, wherein the load is coupled to the amplifier by an LCL impedance matching network.

26. A system, comprising:
a network configured for energizing a load;
an amplifier coupled to the network; and
a processor configured to:
- compensate for impedance changes in the network based upon a feedback signal determined based on a bus voltage and a fundamental AC output voltage of the amplifier, wherein the bus voltage corresponds to a voltage driving the amplifier and the amplifier fundamental AC output voltage corresponds to a fundamental component of voltage input to a load of the amplifier;
- maintain a given ratio of the bus voltage and the amplifier fundamental AC output voltage within a range based on the feedback signal, wherein the range includes a minimum value and a maximum value;
- decrease an impedance in the network when the feedback signal is less than the minimum value; and
- increase an impedance in the network when the feedback signal is above the maximum value.

27. An article, comprising:
a non-transitory computer readable medium containing stored instructions that enable a machine to:
- compensate for impedance changes in a network that includes a load, wherein the network is configured for coupling to an amplifier which has a fundamental AC output voltage that varies with the load impedance of the amplifier, by:
  - determining a feedback signal based on a bus voltage and the amplifier fundamental AC output voltage, wherein the bus voltage corresponds to a voltage driving the amplifier and the amplifier fundamental AC output voltage corresponds to a fundamental component of voltage input to a load of the amplifier; and
  - maintaining a given ratio of the bus voltage and the amplifier fundamental AC output voltage within a range based on the feedback signal, wherein the range includes a minimum value and a maximum value; and
- generating one or more signals to decrease an impedance in the network when the feedback signal is less than the minimum value and increase an impedance in the network when the feedback signal is above the maximum value.

* * * * *